United States Patent [19]

Sakamoto et al.

[11] 4,426,152

[45] Jan. 17, 1984

[54] METHOD AND MACHINE FOR POSITIONING FILMS ON BASE SHEETS

[75] Inventors: Takashi Sakamoto; Tetsuo Sano, both of Kyoto, Japan

[73] Assignee: Dainippon Screen Seizo Kabushiki Kaisha, Kyoto, Japan

[21] Appl. No.: 382,142

[22] Filed: May 26, 1982

Related U.S. Application Data

[63] Continuation of Ser. No. 118,190, Feb. 4, 1980, abandoned.

[30] Foreign Application Priority Data

Feb. 14, 1979 [JP] Japan ................................. 54-14911

[51] Int. Cl.³ ............................................ G03B 27/62
[52] U.S. Cl. ........................................ 355/75; 355/77
[58] Field of Search ................... 355/88, 78, 53, 75, 355/77; 271/90

[56] References Cited

U.S. PATENT DOCUMENTS

| | | | |
|---|---|---|---|
| 1,625,578 | 4/1927 | Tremper | 271/90 |
| 3,844,655 | 10/1974 | Johannsmeier | 355/75 |
| 3,873,202 | 3/1975 | Inoue | 355/88 |
| 3,876,301 | 4/1975 | Kosugi et al. | 355/53 |

Primary Examiner—Monroe H. Hayes
Attorney, Agent, or Firm—Lackenbach, Siegel, Marzullo, Presta & Aronson

[57] ABSTRACT

A method and machine for positioning films on base sheets is disclosed. A first film on a base sheet is laid out into a desired position on a base plate, and positions of register marks attached on the first film are detected by photoelectric detectors including photoelectric elements which detect the register marks and output signals whose strengths are varied depending on the positions of the elements with respect to the register marks. Then, a second film on a base sheet is put on the first film so that the register marks on the second film, which are marked in the same positions as those of the first film, may approximately overlap those register marks of the first film, and the register marks of the second film become coincident with those of the first film by moving the second film by means of a drive means according to the output signals from the photoelectric elements, thereby positioning the second film into the desired position.

12 Claims, 13 Drawing Figures

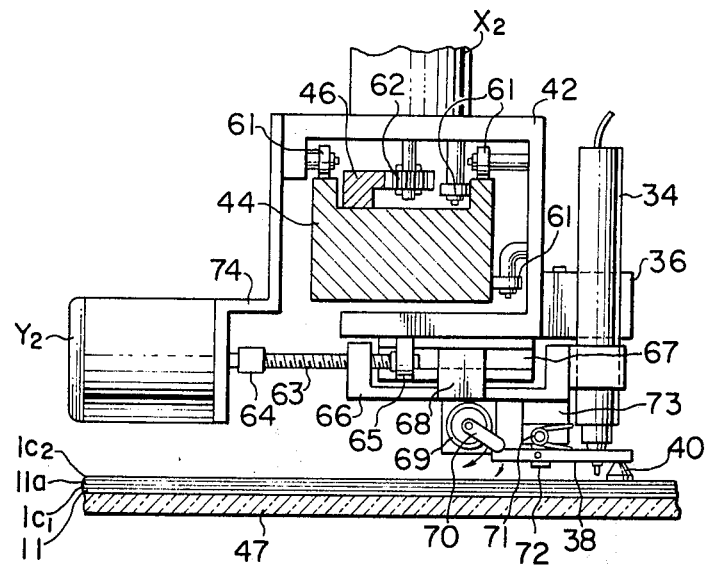
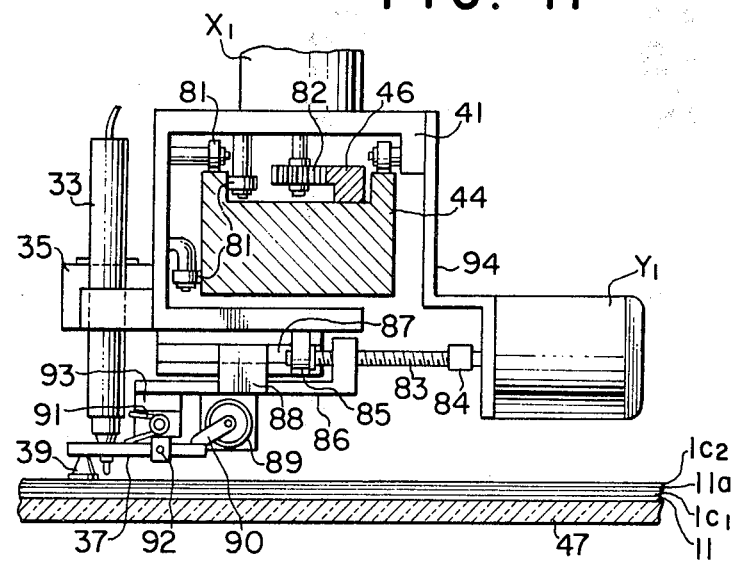

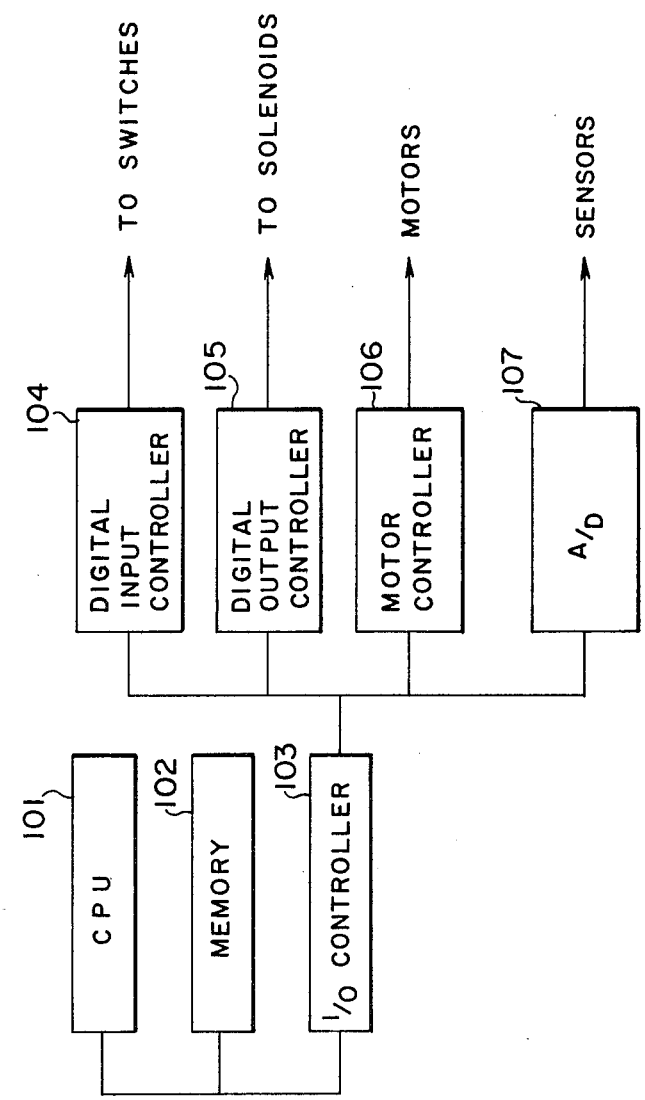

METHOD AND MACHINE FOR POSITIONING FILMS ON BASE SHEETS

This is a continuation, of application Ser. No. 118,190, filed Feb. 4, 1980, now abandoned.

BACKGROUND OF THE INVENTION

The present invention relates to a method and machine for positioning films, such as color separation films used in multi-color printing, on transparent base sheets according to a desired layout.

As is well known, color printing is performed by superimposing different colored inks by employing a plurality of printing plates which are produced by separating an original picture into several colors; for example, cyan, magenta, yellow, and black.

When a printing layout includes several pictures, each picture is generally color-separated independently and color separation films of each picture are made separately. Then, the color separation films for each color are collated and mounted on a transparent base and are printed in contact with a printing plate material, such as a pre-sensitized plate to obtain an original color separation plate for printing of the desired layout.

It is essential that the various color plates print precisely in coincidence, to prevent "color mackle", which would otherwise impair the printing quality, and thus it is critical that the relative positions of the various picture, mounted on the layouts for each color, exactly correspond. Hitherto, several methods have been developed for performing the positioning operation of mounting the color separation films on the layouts, and a summary of some of these known methods is set forth hereinbelow.

In the first method, which is at present the one which is most frequently used, position lines for the original films are drawn on a backing sheet of the necessary size, according to the desired layout. A transparent base is overlaid on the backing sheet and then for one of the separation colors, the separation films for each picture are laid individually on the transparent base by adjusting registration marks on the films to coincide with marks on the backing sheet by eye and they are secured to the transparent base by adhesive tape, to obtain a first original color separation plate. This process is repeated for each color to obtain all of the original color separation plates.

By this method, however, the accuracy of the setting positions of the films depends on the skill and care of an operator and accordingly it is unstable and erratic. Furthermore, the operational speed is low.

In a second known method, the transparent bases for each color, and the original color separation films are provided with punched apertures and the positioning of the color separation films on the transparent bases is effected by inserting registering pins into the punched apertures.

In this method, for instance, when four color inks are used for printing, four transparent bases (one of each color) are put on the backing sheet and the four original color separation films of each picture are placed on the four transparent bases one by one, according to the desired layout. Then, the four transparent bases and each set of four color separation films are punched all together in a single operation, and then separated one from another. The transparent base sheets and the color separation films of each color, which are recollated, are positioned by using the register pins, as mentioned above. In practice, however, this method is prone to errors due to slippage when the eight film sheets are punched together. If, for example, the operator uses a handheld power drill for the punching operation, which is convenient in a plate-making factory, it is fairly difficult to maintain a position perpendicular to the film sheets, so errors in the alignment of the apertures in the film sheets are liable to occur. Furthermore, the operation of inserting and removing the registering pins is troublesome and time consuming.

In a third method, the positions of the register marks of the original color separation films are detected by photoelectric detector means and the original color separation films are automatically moved to the correct positions if the register marks are out of alignment, and then are provided with the punched apertures. Then, the original color separation films are laid out on a transparent base sheet which is positioned by inserting the register pins into its punched apertures, by a pinbar, having a pair of standing pins for locating the original color separation film, capable of moving upward and downward and in the X and Y directions over the setting surface of the base sheet for the color separation films. In this method, first the color separation films of one color are located in the desired positions by locating the color separation films for each picture in turn to the pinbar, and the pinbar is moved to the desired alignment on the layout. Then, the position of the color separation film is stored into a memory, and the setting operation for the color separation films of the other colors on the base sheets is repeated by utilizing the stored data in the memory. This method enables accurate positioning of the original films and is highly practicable but requires a large system and accordingly high costs are involved.

In a fourth method, as in a similar manner to the third method, first the original color separation films are automatically positioned in the correct positions and then are punched. Then, the color separation films of one color are laid out on the base sheet by locating the color separation films for each picture to a plurality of pinbars which are fixed to the desired positions during the operations. Then, the setting operation for the color separation films of the other colors on the base sheets are repeated in the same manner as described above. This method does not require a memory and enables accurate positioning of the films but again involves high cost.

SUMMARY OF THE INVENTION

It is, therefore an object of the present invention is provide a method for positioning films on base sheets free from the abovementioned defects, and one which is simple, and enables quick and accurate positioning of the films at lower cost, and which does not require an accurate punching steps for the films.

It is also an object of the present invention to provide a machine for positioning films on base sheets free from the abovementioned defects, and one which is of simple construction, and enables quick and accurate positioning of the films at lower cost, and which does not require an accurate punching means for the films.

According to the present invention, there is provided a method for positioning films on base sheets, comprising the steps of: laying out a first film having register mark means on a first base sheet into a desired position, detecting the position of the register mark means of the first film by a photoelectric detector means including photoelectric element means which detects the register mark means and outputs signals whose strengths are varied depending on the position of the photoelectric element means with respect to the register mark means, overlaying a second film having register mark means in the same position as that of the first film on a second base sheet to the first film so that the register mark means of the second film may approximately overlap to the register mark means of the first film, and moving the second film by a driving means so that the register mark means of the second film is coincident with the register mark means of the first film by controlling the output signals from the photoelectric element means, thereby positioning the second film into a coincident position with respect to said first film.

According to the present invention there is also provided a machine for positioning films on base sheets, comprising: a base plate on which a first film having register mark means on a first base sheet is laid out into a desired position and a second film having register mark means in the same position as that of the first film on a second base sheet is placed on the first film, a photoelectric detector means which is capable of moving over the base plate and includes photoelectric element means which detects the register mark means and outputs signals whose strengths are varied depending on the position of the photoelectric element means with respect to the register mark means, and a drive means for moving the films over the base plate by controlling the output signals from the photoelectric element means so that the register mark means of the second film is coincident with the register mark means of the first film, thereby positioning the second film into a coincident position with respect to said first film.

BRIEF DESCRIPTION OF DRAWINGS

In order that the present invention may be better understood, a preferred embodiment will now be described with reference to the accompanying drawings, in which:

FIG. 10 is a fragmentary side elevational view of the detector table shown in FIG. 7;

FIG. 11 is a further fragmentary side elevational view of another detector table shown in FIG. 7;

FIG. 12 is a schematic view of an electric control means for the machine shown in FIG. 7.

DESCRIPTION OF THE PREFERRED EMBODIMENTS

Prior to the description of the preferred embodiments of the present invention, the above-mentioned third method will be described in connection with FIGS. 1 and 2.

Figure 1:
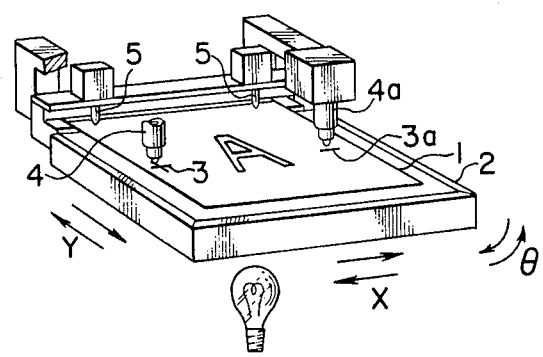
FIG. 1 is a perspective view of a conventional prior art film positioning and punching machine.

A conventional positioning and punching machine is shown in FIG. 1, in which a color separation film 1 is placed on a table 2, and the table 2 is moved in order to position the color separation film 1 in the correct position wherein register marks 3 and 3a attached on the film 1 coincide with photoelectric detectors 4 and 4a including photoelectric detector elements. Then, the color separation film 1 is precisely provided with a pair of punched apertures in its upper portion by a pair of punches 5.

Figure 2:
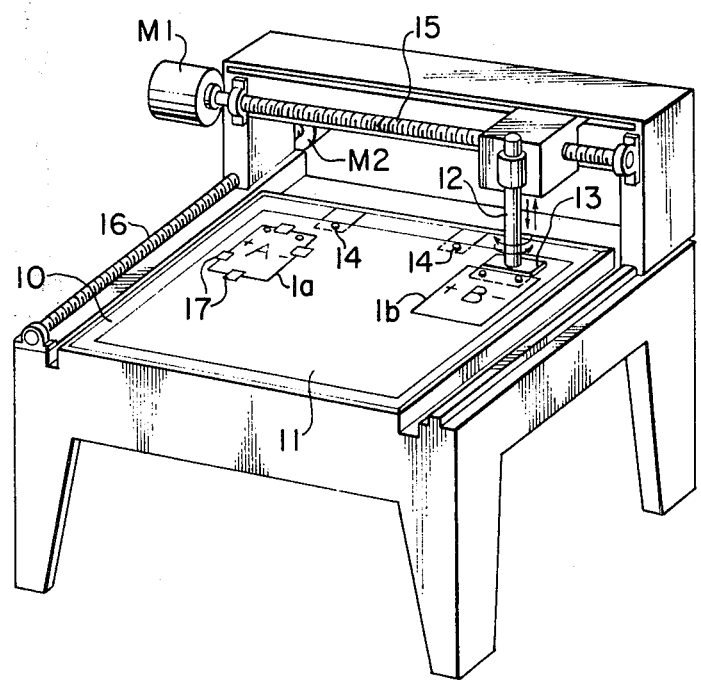
FIG. 2 is a perspective view of a conventional prior art film layout machine.

In FIG. 2 there is shown a conventional film layout machine. On a table 10 a backing sheet and a transparent base sheet 11 overlaid on it are positioned by locating register pins 14 into the punched apertures provided in the base sheet 11. Then first the color separation film 1a punched of one color is located onto a pinbar 13 mounted to the bottom of a movable vertical rod 12 which is adapted to be movable up and down and in X and Y directions by means of screw shafts 15 and 16 driven by motors M1 and M2, by inserting the pinbar into the punched apertures of the color separation film 1a. The pinbar 13 is moved to the desired position on the transparent base sheet 11 and the color separation film 1a is secured to the base sheet 11 by adhesive tapes 17.

The position (the X and the Y direction and an angle θ) of the pinbar 13, that is, the position of the color separation film 1a is stored into a memory (not shown). Then, another color separation film 1b of one color is positioned in the desired position on the base sheet 11 and its position is stored into the memory in the same manner as described above. Then, the setting operation for the color separation films of the other colors on the other base sheets is repeated by utilizing the stored data in the memory.

One embodiment of the present invention will now be described with reference to FIGS. 3-13. The principle of the present invention will be first described in connection with FIGS. 3-6, before describing a machine for positioning films automatically on base sheets, which is best, shown in FIG. 7.

Figure 3:
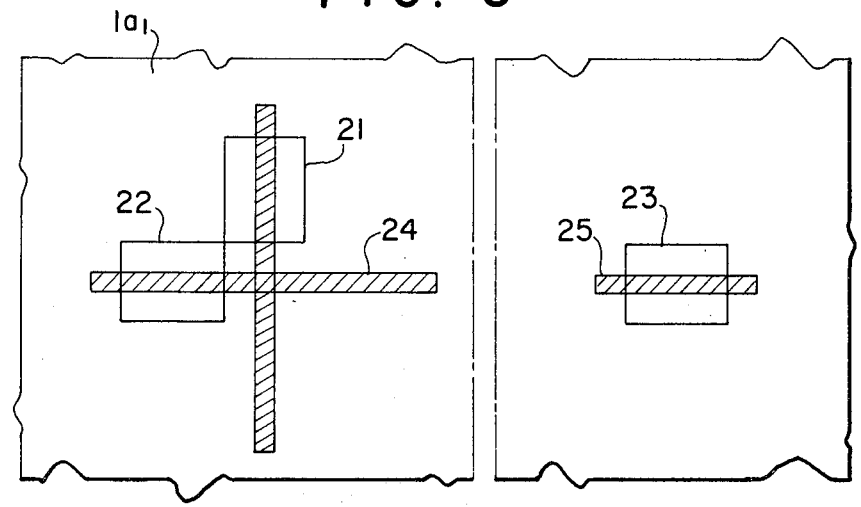
FIG. 3 shows photoelectric detector elements and register marks which cooperate therewith and are, used in the method of the present invention.

FIG. 3 shows schematically three photoelectric detector elements 21-23 which are included in photoelectric register mark detectors 33 and 34 in FIG. 7, as described later, and + and − register marks 24 and 25 which are attached on color separation film, at the end of the setting operation of the color separation film, wherein the register marks 24 and 25 are adjusted in the correct positions with respect to the three elements 21-23.

Figure 5:
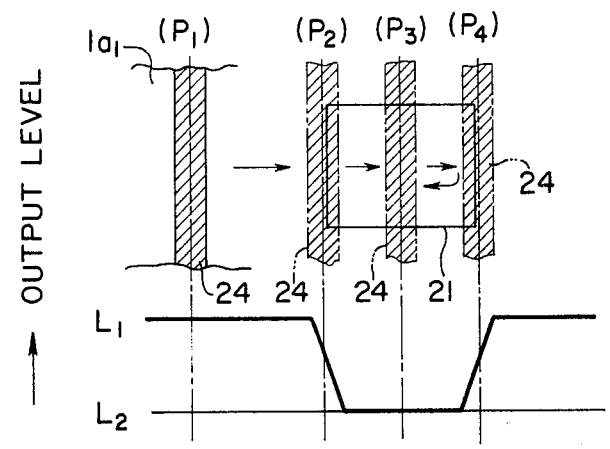
FIG. 5 shows a principle of the positioning of a first film by using a register mark and a photoelectric element in accordance with the present invention.

In FIG. 5, there is shown schematically the positioning of the first color separation film 1a1 on a transparent base sheet and, that is, different positions of the register mark 24 partly shown, on a first color separation film 1a1 which is moved with respect to the detector element 21, and the output level of the detector element 21.

When the register mark 24 attached on the first color separation film 1a1 is positioned out of the element 21 in a position P1, the element 21 receives the light by its entire surface and outputs an output L1. When the register mark 24 is located in a position P3 the element 21 is shaded by the whole width of the register mark 24 and outputs an output L2 which is smaller than L1. When the register mark 24 is moved to positions P2 and P4, the element 21 is shaded by the part of the width of the register mark 24 and outputs an output whose level is between L1 and L2.

As the register mark is moved from the position P1 to the position P4 through the positions P2 and P3, the output level of the element 21 is varied as L1, L2 and L1 as shown in FIG. 5. Accordingly, the positions P2 and P4 are detected and the register mark 24 is positioned in the correct position P3 which is the middle between the positions P3 and P4, thereby positioning the first color separation film 1a1 in the correct position. The color separation film 1a1 is then secured to the base sheet by adhesive tapes.

Figure 4:
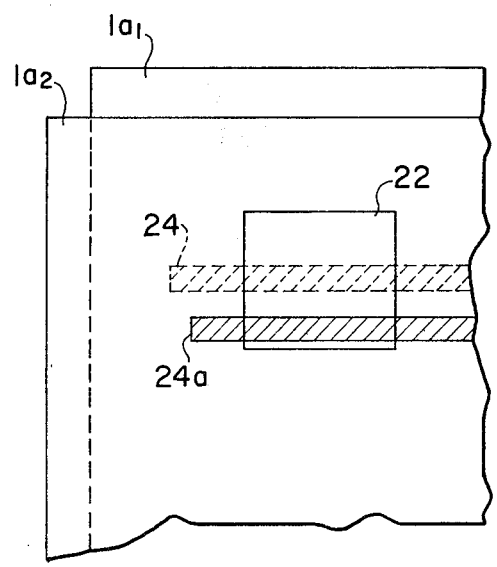
FIG. 4 shows two color films put one on another, each having a register mark which cooperates with a photoelectric detector element in accordance with the present invention.

Then, the second color separation film 1a2 having another register mark 24a on another base sheet, as shown in FIG. 4, will be positioned in the correct position by adjusting the register mark 24a with respect to the detector element 21.

Figure 6:
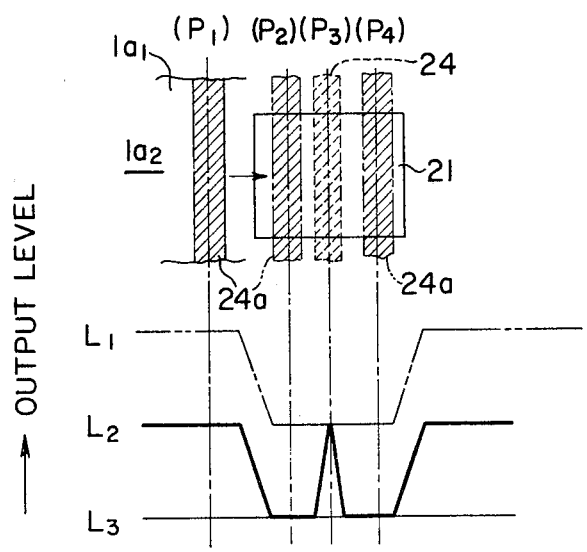
FIG. 6 shows a principle of the positioning of a second film on the first film by using the register mark and the photoelectric element in accordance with the present invention.

FIG. 6 shows schematically, in a similar manner to FIG. 5, the positioning of the second color separation film 1a2 on the transparent base sheet overlaid on the first color separation film 1a1.

The register mark 24a of the second color separation film 1a2 generally having the same width as that of the register mark 24 of the first color separation film 1a1, is moved with respect to the detector element 21. When the mark 24a is positioned out of the element 21 in a position P1, the element 21 is shaded only by the register mark 24 of the first film 1a1 and outputs the output L2. When the element 21 is shaded by the full width of the mark 24a but the mark does not overlap the mark 24, as in positions P2 and P4, the element 21 produces an output L3 which is smaller than L2. When the mark 24a is overlapped entirely to the mark 24, as in a position P3, the element 21 produces the output L2 again.

Hence, as the mark 24a is moved from the position P1 to the position P4 via the positions P2 and P3, the output level of the element 21 changes from L2 to L3, L2, L3 and L2 as shown in FIG. 6. The correct position of the second color separation film 1a2 to be positioned is known by detecting an extreme maximum output value of the detector element 21 (or an extreme minimum output value, when the register marks 24 and 24a are photoelectically negative), wherein the register marks 24 and 24a are entirely overlapped to each other, as described above, thereby positioning the second film 1a2 into the correct position.

In this case, when the width of the register mark 24 of the first color separation film 1a1 is different from that 24a of the second film 1a2. for instance, the former is wider than the latter, the detector element 21 outpus a range of extreme output values. In such a case, both the edges of the range of the extreme output values are detected, and thus the register mark 24a is positioned in the middle of the edges of the range of the extreme output values.

Therefore, it is readily understood that when the register marks 24, 24a, 25 and 25a of the first and the second color separation films 1a1 and 1a2 are overlapped entirely one on another with respect to the detector elements 21, 22 and 23, as shown in FIG. 3, the setting operations for the first and the second color separation films are completed. In this case, of course, the transparent base sheets for the color separation films are positioned exactly in a conventional manner, such as, with respect to a pair of register pins, or the like, which is easily carried out.

The second color separation film together with the base sheet are then removed from the first color separation film, and thereafter the third color separation film on another base sheet is positioned on the first color separation film in the same manner as described above. This operation is repeated for the other color separation films.

Figure 7:
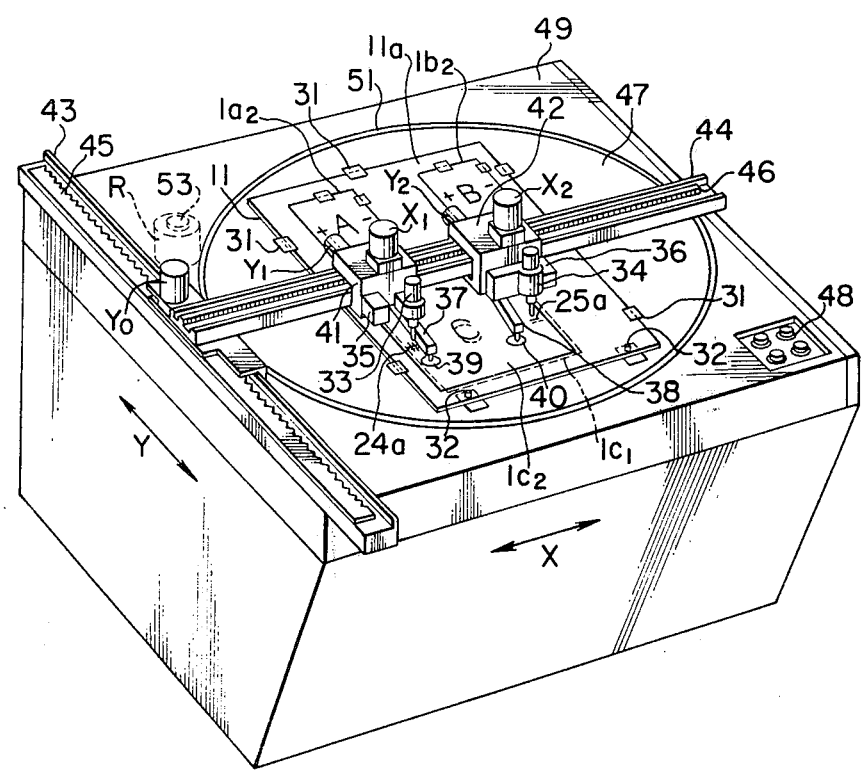
FIG. 7 is a perspective view of a machine for positioning films automatically in accordance with the present invention.

In FIG. 7, there is shown one embodiment of the machine for positioning films automatically on base sheets according to the present invention.

Figure 8:
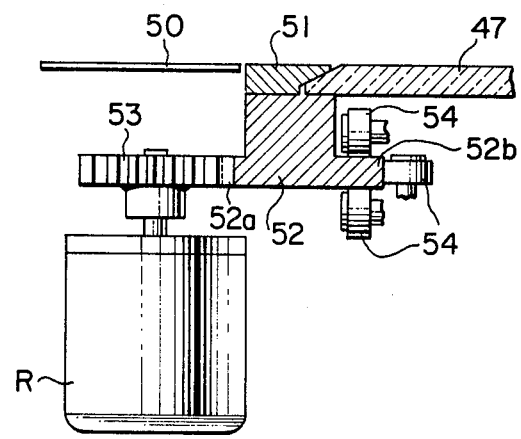
FIG. 8 is a longitudinal cross-sectional view of a drive means for the frosted glass disc shown in FIG. 7.

On a register table 49 a frosted glass disc 47 is rotatably mounted and is driven by a motor R. The drive mechanism portion of the frosted glass disc 47 by the motor R is shown in FIG. 8. To the frosted glass disc 47 is secured a circular ring member 52 through a glass holder 51. The circular ring member 52 is provided with an outer gear 52a in its outer periphery and a guide rail 52b in its inner periphery. The outer gear 52a is engaged with a pinion 53 fixed to the drive shaft of the motor R. The guide rail 52b is supported on its three surfaces by three rollers 54 mounted to the body of the machine. A cover 50 is so arranged outside of the glass holder 51 to be positioned in the same level as the frosted glass disc 47.

Again, in FIG. 7, the frosted glass disc 47 is illuminated by a light source (not shown) disposed in the machine. In this case, the lightening of the entire surface of the disc 47 is not necessary, it is enough to illuminate some portions just under the photoelectric register mark detectors 33 and 34 for detecting the + and the − register marks 24, 24a, 25 and 25a, formed on the color separation films, and thus is adapted to trace the detectors 33 and 34 while the detectors are moved.

A Y direction rail 43 having a rack 45 therealong is mounted to one side of the register table 49. A X direction rail 44 having a rack 46 therealong is movably mounted to the Y direction rail 43 in its one end and is moved in the Y direction by a motor Y0 disposed to the one end of the X direction rail 44. A pair of detector tables 41 and 42 are slidably mounted on the X direction rail 44 and are independently driven therealong by motors X1 and X2 mounted to the tables 41 and 42.

A pair of arms 37 and 38 for moving the color separation film to be positioned together with suction cups 39 and 40 mounted to the front ends of the arms 37 and 38, are movably mounted to the bottom of the detector tables 41 and 42 across the X direction rail 44, and are moved independently in the Y direction by motors Y1 and Y2 mounted to the detector tables. Suitable suction cups 39 and 40 are connected to the suction means (not shown) which works when the suction cups hold the film on the frosted glass disc 47.

Figure 9:
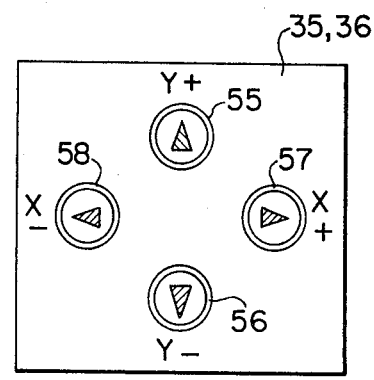
FIG. 9 is a top view of an operational board for a register mark detector shown in FIG. 7.

The + and the − register mark detectors 33 and 34 are vertically secured to one side of the detector table 41 and the free end of the arm 38. A pair of detector operation boards 35 and 36 for positioning the register mark detectors 33 and 34 by driving the motors X1 and Y0; and X2 and Y2 are disposed to the one sides of the detector tables 41 and 42. Such a detector operation board 35 or 36 is shown in FIG. 9 and includes four push switches 55-58 for driving the motors Y0 or Y2 and X1 or X2 so as to move the detectors 33 and 34 in +Y, −Y, +X and −X directions.

An operating panel 48 is arranged in one corner of the register table 49 and is provided with switches for starting and stopping the light source and the motor R for driving the frosted glass disc 47, and for storing and reading the positions of the register mark detectors 33 and 34 into or out of the memory, other switches, pilot lamps, and so forth. Each motor R, X1, X2, Y0, Y1 or Y2 used is preferably a pluse motor so that the coordinates of the members such as the register mark detectors driven by the motors may be stored in the memory by using the pulse numbers output from the motors.

As shown in FIG. 7, on the frosted glass disc 47 the transparent base sheets 11 and 11a are positioned by inserting register pins 32 into the punched apertures formed in one edges of the base sheets 11 and 11a, and are secured to the frosted glass disc 47 by the adhesive tapes 31. On the first base sheet 11 (the lower one in FIG. 7) the first color separation films 1a1, 1b1, and 1c1 for one color such as cyan, are positioned according to the desired layout, and are secured to the base sheet 11 by the adhesive tapes. On the second base sheet 11a put on the first color separation films, the second color separation films 1a2, 1b2 and 1c2 for another color such as magenta, are placed, the two films 1a2 and 1b2 are already positioned and secured to the base sheet 11a by the adhesive tapes and one film 1c2 is now being positioned by adjusting the register marks 24a and 25a attached on the film 1c2 to the detectors 33 and 34 by moving the film 1c2 by using the suction cups 39 and 40 in the same manner as described above.

In FIG. 10 is, there shown the detector table 42 for the − register mark detector 34. The detector table 42 is placed on the X direction rail 44 by four rollers 61 disposed to the table on its top and side surfaces. The motor X2 for driving the table 42 in the X direction is mounted to the table 42. A pinion 62 secured to the drive shaft of the motor X2 engages with the rack 46 on the X direction rail 44, and therefore, as the motor X2 is driven, the table 42 is moved along the X direction rail 44.

The motor Y2 is mounted to the side of the table 42 through a bracket 74. A screw rod 63 is connected to a drive shaft of the motor Y2 via a coupling member 64 in its one end and the other end is supported by a bearing 65 mounted onto the bottom of the table 42. A slide member 66 is provided with a nut member in its rear end, which engages with the screw rod 63. A guide member 67 having a dovetail is secured to the bottom of the table 42 and a guide piece 68 having a dovetail groove which engages with the dovetail of the guide member 67, is mounted onto the middle of the slide member 66. Hence, the slide member 66 is moved in the Y direction by driving the screw rod 63.

The register mark detector 34 is secured to the front end of the slide member 66. On the bottom of the slide member 66 a rotary solenoid 69 having an actuating lever 70 and a support block 73 are mounted. The arm 38 having the suction cup 40 in its front end is pivotally mounted to the support block 73 through a pivot pin 72. The front part of the arm 38 is biased downward by a spring 71 and the rear end of the arm 38 is contacted with the actuating lever 70 of the solenoid 69.

When the solenoid 69 is actuated, the actuating lever 70 is turned downward and thus pushes down the rear end of the arm 38, thereby pivoting upward its front end. When the front end of the arm 38 is lowered by switching off the solenoid 69, the suction cup 40 contacts to the color separation film 1c2 and holds some while the suction means is switched on. Then, the rotary solenoid 69 is actuated, the arm 38 and the suction cup 40 hold up the film 1c2.

In FIG. 11, there is shown the detector table 41 for the + register mark detector 33. The construction shown in FIG. 11 is almost the same as that in FIG. 10, except that the detector 33 is secured to the side of the table 41. The motors X1 and Y1 correspond to those X2 and Y2, and rollers 81, a pinion 82, a screw rod 83, a coupling member 84, a bearing 85, a slide member 86, a guide member 87, a guide piece 88, a rotary solenoid 89, an actuating lever 90, a spring 91, a pivot pin 92, a support block 93, and a bracket 94 correspond to those members 61, 62, 63, 64, 65, 66, 67, 68, 69, 70, 71, 72, 73, and 74, respectively, in FIG. 10.

There is shown in FIG. 12 an electric control system. The switches 108 for turning on or off the electric source, driving the detector tables 41 and 42, starting the automatic operation for the positioning, and so on, are manually operated, and the operational signals generated from the operation are detected by a digital input controller 104. The detected signals are sent to an input-/output (I/O) controller 103 and then to a central processing unit (CPU) 101.

The signals processed in the CPU 101 are stored in the memory 102 as occasion demands, and are fed to a digital output controller 105 through the I/O controller 103, with the result that the digital output controller 105 controls the rotary solenoids 69 and 89 which pivot the arms 37 and 38. The signals from the CPU 101 are also sent to a motor controller 106 and an analog-digital (A/D) converter 107 via the I/O controller 103. Then, the motor controller 106 controls, i.e. drives or stops the motors R, Y0, Y1, Y2, X1 and X2, and the A/D converter 107 converts the output analog signals supplied from the sensors such as the photoelectric elements 21, 22 and 23 into digital signals and sends the digital signals to the CPU 101 via the I/O controller 103.

The CPU processes the digital signals input and outputs the digital signals processed to the motor controller 106 for controlling the motors R, Y0, Y1, Y2, X1 and X2 and the digital output controller 105 for controlling the rotary solenoids 69 and 89, and the memory for storing the amounts of the rotations of the motors R, Y0, Y1, Y2, X1 and X2.

The positioning operation for the color separation films of some colors such as cyan, magenta, yellow and black, on the base sheets will be described with reference to FIG. 13.

First, the transparent base sheets 11 are provided with punched apertures to be inserted over the register pins for positioning said base sheets in the precise positions, in a conventional manner such as by hand power punching means, or the like. One of the base sheets 11 punched is positioned by inserting the register pins into the punched apertures on the frosted glass disc 47 and it is then secured to the frosted glass disc 47 by the adhesive tapes. Then, the first color separation films 1a1, 1b1 and 1c1 of one color such as cyan for each picture are positioned on the base sheet 11 according to the desired layout, and are secured to the base sheet 11 by the adhesive tapes 31, as is best shown in FIG. 13(I).

Figure 13:
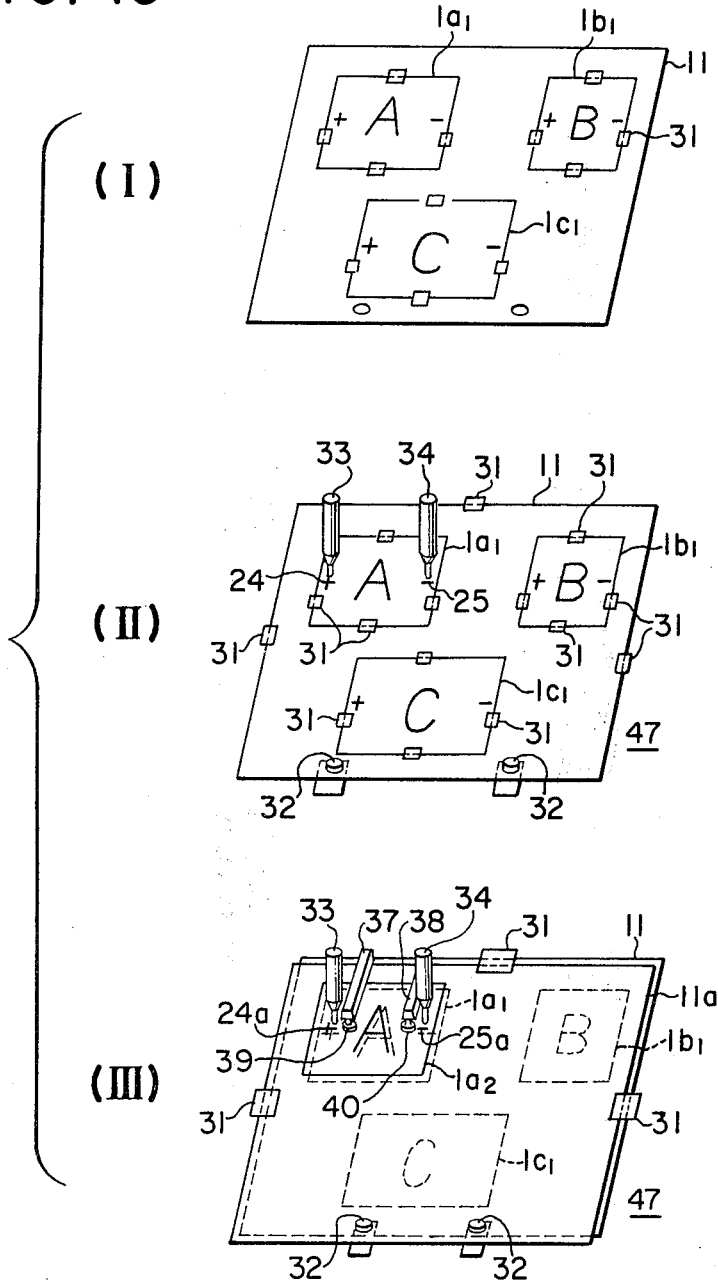
FIG. 13 shows the operational steps of the positioning of films in accordance with the present invention.

Then, as shown in FIG. 13(II), the precise positions of the register marks of the first color separation films $1a1$, $1b1$ and $1c1$ are detected by the machine and are stored in the memory 102 as follows. The film $1a1$ is first detected. The frosted glass disc 47 is turned so that the line on which the register marks 24 and 25 of the film $1a1$ are aligned may approximately be parallel with the X direction rail 44.

Then, the register mark detectors 33 and 34 are moved above the register marks 24 and 25, respectively, by operating manually the swiches 55–58 on the detector operation boards 35 and 36. The switch for the automatic positioning of the detectors 33 and 34 are switched on. The photoelectric detector elements 21–23 in the detectors 33 and 34 cooperate with the register marks 24 and 25 as described above, and send the output signals, depending on the amounts of the lights received, to the A/D converter 107 in which the output signals are converted into the digital signals which are then sent to the CPU 101 via the I/O controller 103.

If the digital signals sent to the CPU 101 are not coincident with the desired values, the CPU 101 controls the motor controller 106 via the I/O controller 103 to drive the motors R, Y0, Y1, Y2, X1 and X2 so that the detector elements 21–23 in the detectors 33 and 34 coincide with the register marks 24 and 25 according to the principle abovementioned, and thereby the detectors 33 and 34 are precisely positioned. Then, the pulse numbers from the standard point for each motor are counted, and depending on them the precise positions of the detectors 33 and 34 or the register marks 24 and 25 of the film $1a1$ are stored in the memory 102.

Then, the precise positions of the register marks on the other films $1b1$ and $1c1$ are also detected and are stored in the memory 102 in the same manner as described above.

Next, as shown in FIG. 13(III), another transparent base sheet $11a$ is located on the first color separation films by inserting the register pins 32 into the punched apertures, and then is secured to the frosted glass disc 47 by the adhesive tapes.

Then, for the setting operation for the second color separation films $1a2$ of another color such as magenta over the first color separation film $1a1$, the detectors 33 and 34 are moved to the stored positions in the memory 102 for the film $1a1$ automatically by switching on a reset switch on the operating panel 48.

The second color separation film $1a2$ is so placed over the first color separation film $1a1$ that the register marks $24a$ and $25a$ on the second film $1a2$ may approximately be coincided with those 24 and 25 on the first film $1a1$. When an adjusting switch on the operating panel 48 is then switched on in order to switch off the powers of the rotary solenoids 69 and 89, the front ends of the arms 37 and 38 are pivoted downward by the springs 71 and 91 and hence the suction cups 39 and 40 in the front ends of the arms 37 and 38 come into contact with the second film $1a2$.

Then, the arms 37 and 38 are raised by actuating the solenoids 69 and 89 again, while the suction cups 39 and 40 hold the film $1a2$. The arm 37 is moved in the Y direction so that the X direction line of the register mark $24a$ of the second film $1a2$ may automatically coincide with the register mark 24 of the first film $1a1$ by driving the motor Y1, and the arm 38 is simultaneously moved in the Y direction so that the register mark $25a$ of the second film $1a2$ may automatically coincide with the register mark 25 of the first film $1a1$ by driving the motor Y2, as described above.

In this operation, since the detector 34 and the arm 38 are fixed to the slide member 66, as the arm 38 is moved in the Y direction, the detector element 23 in the detector 34 is slipped somewhat from the register mark 25 of the first film $1a1$. However, the detector element 23 used is so large enough to cover the register mark 25, and the register mark $25a$ of the second film $1a2$ coincides with the register mark 25 of the first film $1a1$. Accordingly, there is no problem in this operation.

Next, the Y direction line of the register mark $24a$ of the second film $1a2$ is automatically coincidence with the Y direction line of the register mark 24 of the first film $1a1$ by driving the motors X1 and X2, as described above, thereby perfectly adjusting the second film $1a2$ over the first film $1a1$. The second film $1a2$ is then secured to the second base sheet $11a$ by the adhesive tapes.

The adjusting order of these Y and X directions of the register marks 24 and $24a$; and 25 and $25a$ described above may be interchangeable or may be done at the same time. Further, when the adjustment firstly conducted of the register marks in the Y direction comes out of the correct position after the adjustment done secondly to those in the X direction, these adjustments in the X and the Y directions are repeated.

Then, the setting operation for the second color separation films $1b2$ and $1c2$ is repeated in the same manner as described above, and the films $1b2$ and $1c2$ are secured to the base sheet $11a$ by the adhesive tapes.

The second base sheet $11a$ with the second color separation films $1a2$, $1b2$ and $1c2$ thereon is then removed from the register pins 32, and the other color separation films of the other colors such as yellow and black are laid out on the other transparent base sheets overlaid on the first color separation films in the same manner as described above.

When the register marks attached on the film are inclined, the frosted glass disc 47 supporting the films is turned so that the register marks may direct the X and the Y directions.

According to the present invention, reflective films and transparent films may be positioned with respect to one another by properly illuminating the detector positions or changing the position of the light source therefor.

Although the present invention has been shown and described in terms of a preferred embodiment thereof, however, various changes and modifications can be made by those skilled in the art without departing from the scope of the present invention.

What is claimed is:

1. A method for positioning films on base sheets, comprising the steps of:
   (a) laying out a first film having register mark means on a first base sheet into a desired position;
   (b) detecting the position of the register mark means of the first film by a photoelectric detector means including photoelectric element means which detects the register mark means and outputs signals whose strengths are varied depending on the position of the photoelectric element means with respect to the register mark means, and wherein said step of detecting includes a step of placing a detector viewing window of the photoelectric detector means in registeration with the register mark means of the first film;

(c) overlaying a second film upon the first film, the second film having register mark means in the same position as that of the first film so that the register mark means of the second film may approximately overlap the register mark means of the first film;

(d) sensing rising and falling amounts of light received by the detector means resulting from movement of the second film across the combined reticle structure of the first film register marks superposed on the detector viewing window; and (e) moving the second film by a driving means so that the register mark means on the second film is displaced from a position outside a view of the window to a position within the view of the window and becomes coincident with the register mark means of the first film by detecting an extreme value of the signal output among the output signals from the photoelectric element means, thereby positioning the second film into a coincident position with respect to said first film.

2. A method as claimed in claim 1, wherein the position of the register mark means of the first film is detected by the photoelectric detector means, and then the position of the photoelectric detector means is stored in a memory, and wherein the photoelectric detector means is automatically positioned in the stored position in the memory when the second film is positioned over the first film.

3. A method as claimed in claim 2, wherein the output signals from the photoelectric element means are controlled by an electric controller.

4. A method as claimed in claim 3, wherein the register mark means on said films comprises + and − register marks which are away one from another at a certain distance, and the photoelectric means comprises + and − photoelectric detectors, and wherein the photoelectric element means comprises two photoelectric elements included in the + photoelectric detector and a photoelectric element included in the − photoelectric detector, the + and the − register marks cooperating with the + and the − photoelectric detectors respectively.

5. A machine for positioning films on base sheets, comprising:
(a) a base plate on which a first film having register mark means on a first base sheet is laid out into a desired position, and a second film having register mark means in the same position as that of the first film on a second base sheet placed on the first film; said register mark means being configured to provide a double-lobed radiation pattern during a relative movement between said mark means under illumination;
(b) a photoelectric detector means capable of moving over the base plate including photoelectric element means which detects the register mark means and output signals whose strengths are varied depending on the position of the photoelectric element means with respect to the register mark means; and
(c) a drive means for moving said second film over the base plate by detecting a null of the signal output among the output signals from the photoelectric element means, so that the register mark means of the second film become coincident with the register mark means of the first film, thereby positioning the second film into a coincident position with respect to said first film.

6. A machine as claimed in claim 5, wherein the signals output from the photoelectric element means are controlled by an electric controller.

7. A machine as claimed in claim 6, wherein the film is moved over the base plate by suction cups actuated by suction means.

8. A machine as claimed in claim 7, wherein one of the suction cups is connected to one of the photoelectric detector means, so as to move together.

9. A machine as claimed in any one of claims 6-8, wherein the base plate is made of a frosted glass and is adapted to be turned by further drive means.

10. A machine as claimed in claim 9, wherein the register mark means on said films comprises + and − register marks which are away one from another at a certain distance, and the photoelectric detector means comprises + and − photoelectric detectors which cooperate with the + and the − register marks, and wherein the photoelectric element means comprises two photoelectric elements included in the + photoelectric detector and a photoelectric element included in the photoelectric detector.

11. A method for positioning films on base sheets, comprising the steps of:
(a) laying out a first film having a register mark means on a first base sheet into a desired position;
(b) detecting the position of the register mark means of the first film by a photoelectric detector means including photoelectric element means which detects the register mark means and output signals whose strengths are varied depending on the position of the photoelectric element means with respect to the register mark means, and wherein said step of detecting includes a step of placing a detector viewing window of the photoelectric detector means in registration with the register mark means of the first film;
(c) overlaying a second film having register mark means in the same position as that of the first film on the first film so that the register mark means of the second film may approximately overlap the register mark means of the first film;
(d) sensing rising and falling amounts of light received by the detector means resulting from movement of the second film across the combined reticle structure of the first film register marks superposed on the detector viewing window; and
(e) orienting said register mark of said second film with the register mark of said first film to provide a double-lobed radiation pattern to light received by said photodetector; and
(f) moving the second film by a driving means so that the register mark means of the second film is displaced from a position outside a view of the window to a position within the view of the window and becomes coincident with the register mark means of the first film by detecting a null of the radiation pattern in the output signal from the photoelectric means, thereby positioning the second film into a coincident position with respect to said first film.

12. A machine for positioning films on base sheets, comprising:
(a) a base plate on which a first film having register mark means on a first base sheet is laid out into a desired position, and a second film having register mark means in the same position as that of the first film laid out on the first film, said register mark means being configured to provide a double-lobed radiation pattern during a relative movement between said mark means under illumination;

(b) a photoelectric detector means including a viewing window for detecting the register mark means and for outputting signals whose strengths are varied depending on the relative position between the window and each of the register mark means; and (c) a drive means for moving said second film over the base plate by detecting a null of the radiation pattern in the output signals from the photoelectric detector means, so that the register mark means of the second film is displaced from a position outside a view of the window to a position within the view of the window and becomes coincident with the register mark means of the first film set within a mid-portion of the view of the window, thereby positioning the second film into a coincident position with respect to said first film position.

* * * * *